(12) United States Patent
Om

(10) Patent No.: US 7,566,618 B2
(45) Date of Patent: Jul. 28, 2009

(54) NON-VOLATILE MEMORY DEVICE HAVING SONOS STRUCTURE AND MANUFACTURING METHOD THEREOF

(75) Inventor: Jae Chul Om, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/683,718

(22) Filed: Mar. 8, 2007

(65) Prior Publication Data
US 2008/0006873 A1    Jan. 10, 2008

(30) Foreign Application Priority Data
Jul. 5, 2006   (KR) ................. 2006-63134

(51) Int. Cl.
*H01L 21/336* (2006.01)
(52) U.S. Cl. ................. 438/261; 257/E21.679
(58) Field of Classification Search ........... 438/261, 438/954, 957; 257/E21.679
See application file for complete search history.

(56) References Cited
U.S. PATENT DOCUMENTS
5,338,954 A * 8/1994 Shimoji ............ 257/326
6,574,143 B2 * 6/2003 Nakazato ............ 365/185.18
2004/0232478 A1   11/2004 Kim et al.
2006/0131633 A1    6/2006 Bhattacharyya FOREIGN PATENT DOCUMENTS
KR   1020050066550 A   6/2005
KR   1020060011478 A   2/2006

* cited by examiner

*Primary Examiner*—Chandra Chaudhari
(74) *Attorney, Agent, or Firm*—Marshall, Gerstein & Borun LLP

(57) ABSTRACT

A non-volatile memory device having a SONOS structure and a manufacturing method thereof, where a conductive layer is formed between a charge trap layer and a blocking insulation layer of the SONOS structure. Therefore, when a voltage is applied to a gate, the conductive layer undergoes voltage distributions. Accordingly, a desired voltage can be applied to the blocking insulation layer, the charge trap layer and the tunnel insulating layer by controlling the effective oxide thickness (EOT) of the blocking insulation layer and the EOT of the charge trap layer and the tunnel insulating layer. It is therefore possible to improve the erase speed of a cell.

14 Claims, 3 Drawing Sheets

NON-VOLATILE MEMORY DEVICE HAVING SONOS STRUCTURE AND MANUFACTURING METHOD THEREOF

BACKGROUND OF IN THE INVENTION

The invention relates, in general, to a non-volatile memory device and, more particularly, to a non-volatile memory device having a Polysilicon Oxide Nitride Oxide Semiconductor (SONOS) structure with an improved erase speed, and a manufacturing method thereof.

Nonvolatile Semiconductor Memories (NVSM) are largely classified into floating gate series and Metal Insulator Semiconductor (MIS) series in which two or more kinds of dielectric layers are laminated doubly or triply in terms of the process technology.

The floating gate series implements a memory characteristic by employing a potential well. A representative example of the floating gate series is an EPROM Tunnel Oxide (ETO) structure that has been widely used as flash Electrically Erasable Programmable Read Only Memory (EEPROM). The MIS series performs a memory function by employing traps existing at the dielectric layer bulk, the dielectric layer-the dielectric layer interface, and the dielectric layer-semiconductor interface. A representative example of the MIS series is a Metal/Polysilicon Oxide Nitride Oxide Semiconductor (MONOS/SONOS) that has been widely used as flash EEPROM.

A difference between the SONOS and general flash memory is that in the general flash memory, charges are stored in the floating gate, whereas in the SONOS, charges are stored in the nitride layer in terms of the structure.

Furthermore, in the general flash memory, the floating gate is formed using polysilicon. Thus, if any one defect exists in polysilicon, the retention time of charge is significantly lowered. In contrast, in the SONOS, the nitride layer is used instead of polysilicon as described above. Accordingly, the sensitivity to defect in process is relatively small.

In addition, in the flash memory, tunnel oxide having a thickness of about 70 Å is formed under the floating gate. There is a limit to the implementation of a low-voltage and high-speed operation. However, in the SONOS, direct tunneling oxide is formed under the nitride layer. It is therefore possible to implement a memory device having a lower voltage, lower power and high-speed operation.

A conventional flash memory device having a SONOS structure described below with reference to FIG. 1.

Referring to FIG. 1 a tunnel oxide layer 11, a nitride layer 12, a blocking oxide layer 13, a polysilicon layer 14, and a gate electrode 15 are sequentially formed over a semiconductor substrate 10. Word line patterns are then formed by an etch process.

In the flash memory device having a the SONOS structure, a different electric field (E-field) cannot be applied to an insulating layer because the same E-field cannot be applied to the whole complex layer of the blocking oxide layer 13 (i.e., an insulating layer), the nitride layer 12 (for storing charges) and the tunnel oxide layer 11.

In this case, if a voltage is applied to the gate electrode 15 so as to erase charges stored in the nitride layer 12, the charges stored in the nitride layer 12 are moved to the semiconductor substrate 10 by a Fowler-Nordheim (F-N) tunneling current through the tunnel oxide layer 11 and are then erased. However, since the same E-field is applied to the blocking oxide layer 13 over the nitride layer 12, the charges are moved from the gate electrode 15 to the nitride layer 12 through the blocking oxide layer 13 and are then programmed again, so that the erase speed is slowed.

To prevent the charges from being injected from the gate electrode 15 at the time of the erase operation, a material having a high work function is used in the gate electrode 15. However, this method is limited in terms of its improvement of the erase speed.

SUMMARY OF THE INVENTION

Accordingly, the invention addresses the above problems, and provides a method of manufacturing a non-volatile memory device having a SONOS structure capable of improving the erase speed of a cell, in which a conductive layer is formed between a charge trap layer and a blocking insulation layer of the SONOS structure such that when a voltage is applied to the gate, the conductive layer undergoes voltage distributions, and a desired voltage is applied to the blocking insulation layer, the charge trap layer and the tunnel insulating layer by controlling the effective oxide thickness (EOT) of the blocking insulation layer and the EOT of the charge trap layer and the tunnel insulating layer.

According to one aspect, the invention provides a non-volatile memory device, including a tunnel insulating layer formed over a semiconductor substrate, a charge trap layer formed over the tunnel insulating layer, a blocking gate formed over the charge trap layer, a blocking insulation layer formed over the blocking gate, and a gate electrode formed over the blocking insulation layer.

According to another aspect, the invention provides a method of manufacturing a non-volatile memory device, including the steps of forming a tunnel insulating layer over a semiconductor substrate, forming a charge trap layer over the tunnel insulating layer, forming a blocking gate over the charge trap layer, forming a blocking insulation layer over the blocking gate, and forming a gate electrode formed over the blocking insulation layer.

DESCRIPTION OF SPECIFIC EMBODIMENTS

Hereinafter, specific embodiments according to the invention will be described with reference to the accompanying drawings.

FIGS. 2 to 7 are cross-sectional views illustrating a method of manufacturing a non-volatile memory device according to an embodiment of the invention.

Figure 1:
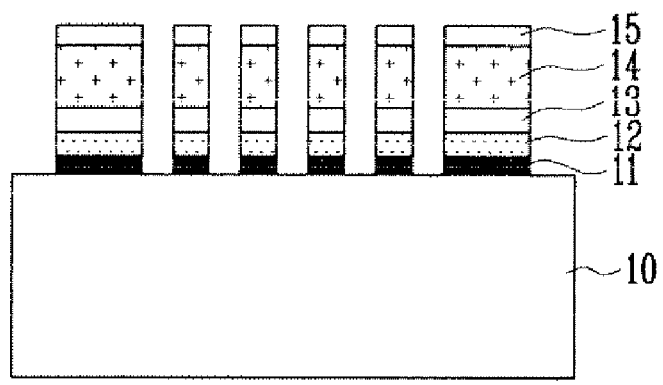
FIG. 1 is a cross-sectional view of a conventional flash memory device having a SONOS structure.
Figure 2:
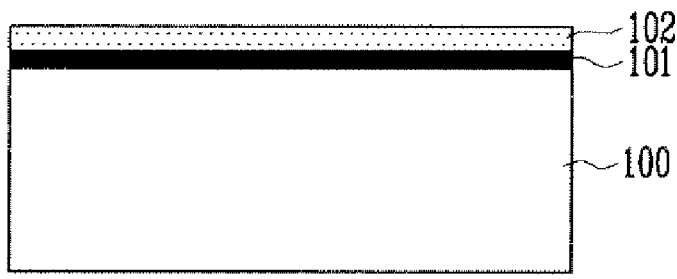
FIGS. 2 to 7 are cross-sectional views illustrating a method of manufacturing a non-volatile memory device according to an embodiment of the invention.

Referring to FIG. 2, a tunnel insulating layer 101 and a charge trap layer 102 are sequentially formed over a semiconductor substrate 100. The tunnel insulating layer 101 is preferably formed using $SiO_2$ and the charge trap layer 102 is preferably formed using $Si_3N_4$. It is preferred that each of the tunnel insulating layer 101 and the charge trap layer 102 is formed to a thickness of 2 Å to 500 Å. Furthermore, the tunnel insulating layer 101 is preferably formed by a wet oxidization method or radical oxidization method, and the charge trap layer 102 is preferably formed by an Atomic Layer Deposition (ALD), Plasma-Enhanced ALD (PE-ALD) or a Chemical Vapor Deposition (CVD) method and then undergoes a Rapid Thermal Annealing (RTA) process.

Figure 3:
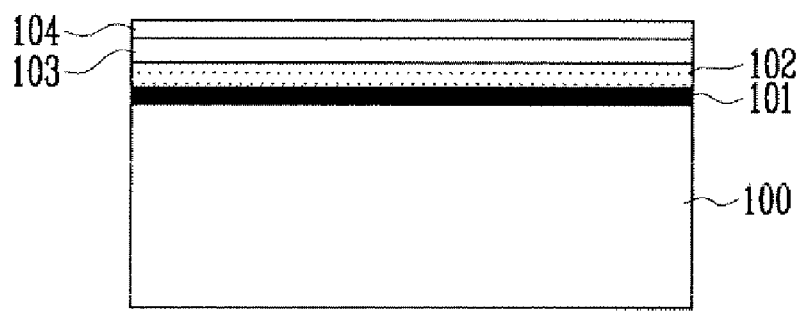

Referring to FIG. 3, a blocking gate 103 and a blocking insulation layer 104 are sequentially formed over the entire surface including the charge trap layer 102. The blocking gate 103 is formed using a conductive material. A conductive material is polysilicon, metal, or both. The blocking insulation layer 104 is preferably formed using $SiO_2$. The blocking insulation layer 104 is preferably formed using an oxide layer with a high dielectric constant, such as $AL_2O_3$, $HfO_2$, $ZrO_3$, $AL_2O_3$, a —$HfO_2$ containing mixture, $SrTiO_3$, $La_2O_3$, or $(Ba, Sr)TiO_3$.

Furthermore, the blocking insulation layer 104 is preferably formed using a radical oxidization method by an atomic layer deposition (ALD) method, a plasma-enhanced chemical vapor deposition (PE-ALD) method, or a chemical vapor deposition (CVD) method, and preferably subsequently undergoes a rapid thermal annealing (RTA) process. It is also preferred that the blocking insulation layer 104 be formed to a thickness of 2 Å to 500 Å preferably at a deposition temperature of 200° C. to 1000° C. The rapid thermal annealing (RTA) process is then performed at a temperature higher than the deposition temperature. The rapid thermal annealing (RTA) process is preferably using an oxidization gas at a step-up rate of 1° C. to 100° C./sec. In this case, a SiN layer may be used instead of the blocking insulation layer 104.

Figure 4:
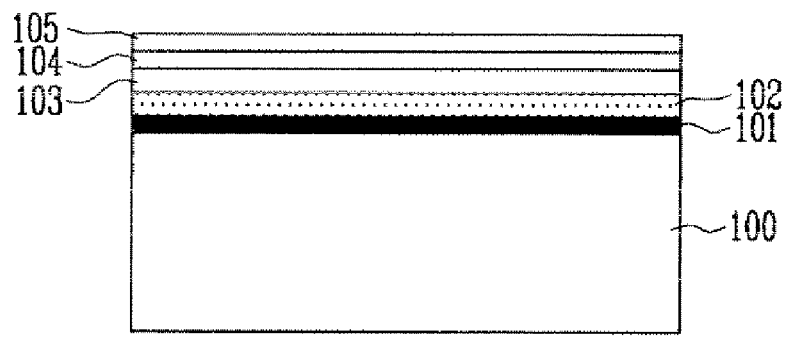

Referring to FIG. 4, a capping polysilicon layer 105 for a mask is formed over the entire surface including the blocking insulation layer 104.

Figure 5:
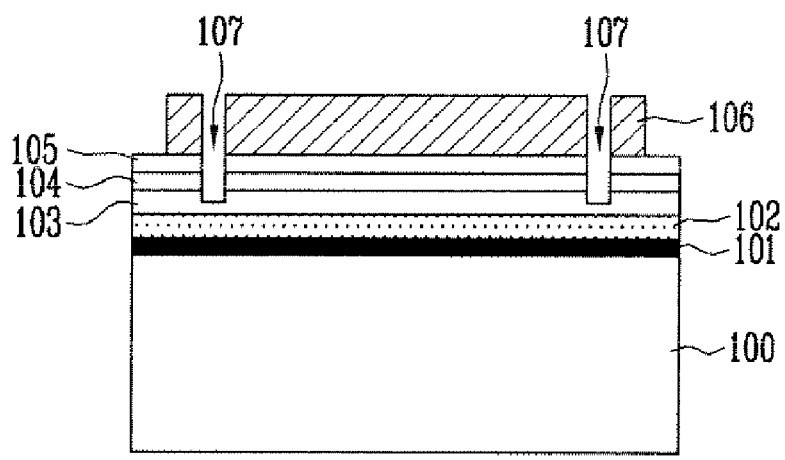

Referring to FIG. 5, a contact mask 106 is formed over the capping polysilicon layer 105. An etch process employing the contact mask 106 is performed to form openings 107 through which the blocking gate 103 is exposed at portions of a region in which drain and source select transistors extending through the blocking insulation layer to the blocking gate will be formed. In this case, the openings 107 through which the blocking gate 103 is exposed may expose a predetermined region of the blocking gate or the whole region of the source and select transistors. The contact mask 106 is preferably formed using a nitride layer, an oxide layer, amorphous carbon photoresist or the like.

Figure 6:
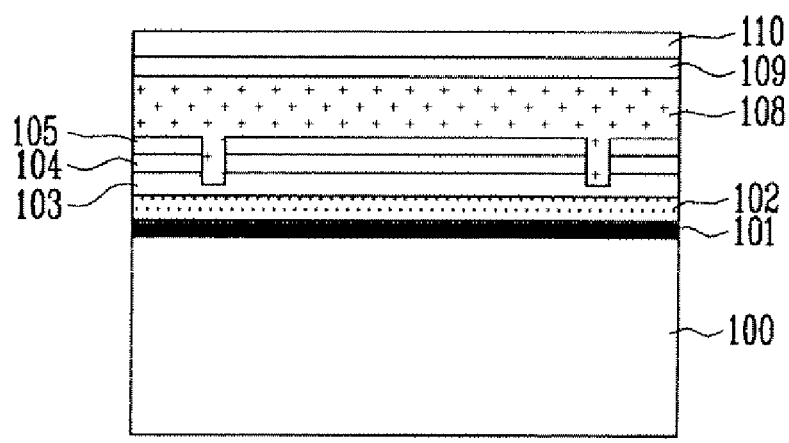

Referring to FIG. 6 after the contact mask 106 is stripped, a polysilicon layer 108 is formed to fully gap-till the openings 107. A metal layer 109 and a hard mask 110 are sequentially formed over the entire surface including the polysilicon layer 108. The metal layer 109 is preferably formed using tungsten, tungsten silicide, tungsten nitride, Ru, Ir, $RuO_2$, $IrO_2$, Pt, or the like. The hard mask 110 is preferably formed using a nitride layer or oxide layer, or may be formed by inserting an oxide layer before the nitride layer is formed. In a region in which the gates of the source and drain select transistors are formed, a voltage source is connected to the blocking gate 103 through the openings 107. It is therefore possible to reduce a thickness of the floating layer.

Figure 7:
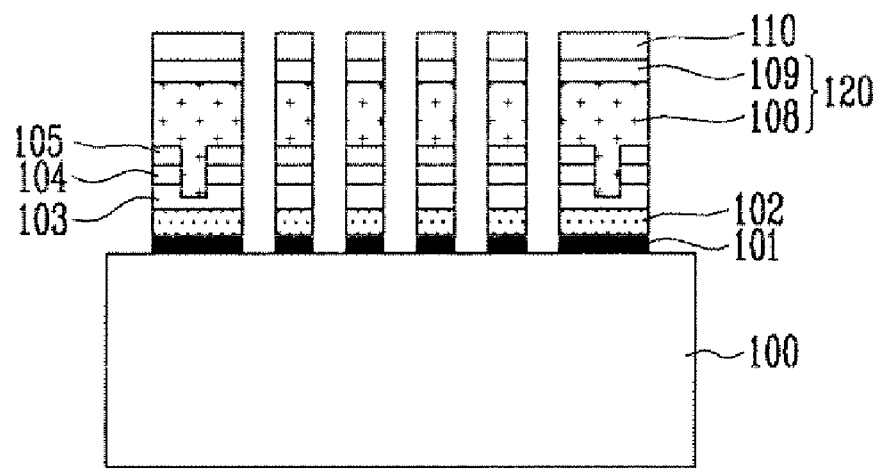

Referring to FIG. 7, an etch process is performed to etch the hard mask 110, the metal layer 109, the polysilicon layer 108, the capping polysilicon layer 105, the blocking insulation layer 104, the blocking gate 103, the charge trap layer 102, and the tunnel insulating layer 101 sequentially and partially, thereby forming the gate patterns of the memory cell and the gate patterns of drain and source transistors. A gate electrode 120 is defined the polysilicon layer 108 and the metal layer 109. The gate electrode 120 is connected to the blocking gate 103 through the opening 107.

Figure 8:
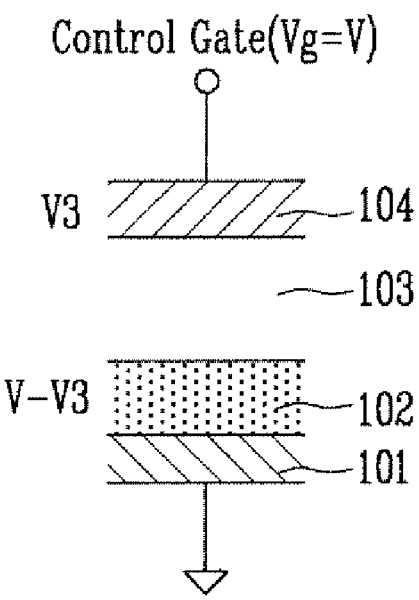
FIG. 8 is a conceptual view illustrating E-field formed in a device according to an embodiment of the invention.

FIG. 8 is a conceptual view illustrating E-field formed in the device according to an embodiment of the invention.

Referring to FIG. 8, if a gate voltage Vg is applied to the gate of the memory cell, the voltage is distributed according to a ratio of capacitance of the blocking insulation layer 104 and capacitance of the tunnel insulating layer 101 and the charge trap layer 102. This can be expressed in the following equation.

$E3-V3/T3=C*V/[C3*T3]$ (thickness)$T-T1$ (tunnel insulating layer)+$T2$ (charge trap layer)+$T3$ (blocking insulation layer)

$1/C=(1/C1+1/C2+1/C3)$:

C1 (tunnel insulating layer capacitance), C2 (charge trap layer capacitance), C3 (blocking insulation layer capacitance)

Therefore, in the prior art, E-field was determined by the dielectric constant of a laminated material. However, in the invention, E-field can be controlled by controlling capacitance of the lamination layer other than the dielectric constant. Accordingly, the voltage Vg applied to the gate is distributed by the blocking gate 103 so that a relatively low voltage is applied to the blocking insulation layer 104 and a relatively high voltage is applied to the charge trap layer 102 and the tunnel insulating layer. It is thus possible to improve an erase characteristic.

In accordance with an embodiment of the invention, the conductive layer is formed between the charge trap layer and the blocking insulation layer. Thus, when a voltage is applied to the gate, the conductive layer experiences voltage distributions. Accordingly, a desired voltage can be applied to the blocking insulation layer, the charge trap layer, and the tunnel insulating layer by controlling the effective oxide thickness (EOT) of the blocking insulation layer and the EOT of the charge trap layer and the tunnel insulating layer. It is therefore possible to improve the erase speed of a cell.

Although the foregoing description has been made with reference to various embodiments, changes and modifications may be made by those of ordinary skill in the art without departing from the spirit and scope of the invention.

What is claimed is:

1. A method of manufacturing a non-volatile memory device, comprising:
    forming a tunnel insulating layer over a semiconductor substrate;
    forming a charge trap layer over the tunnel insulating layer;
    forming a blocking gate on the charge trap layer;
    forming a blocking insulation layer over the blocking gate; and
    forming a gate electrode formed over the blocking insulation layer,
    wherein the charge trap layer prevents contact between the blocking gate and the tunnel insulating layer.

2. The method of claim 1, further comprising etching a portion of the blocking insulation layer to expose the blocking gate in which source and drain select transistors will be formed, thus forming openings through which the blocking gate is exposed.

3. The method of claim 1, comprising forming the tunnel insulating layer, the charge trap layer, and the blocking insulation layer, respectively, to a thickness of 2 Å to 500 Å.

4. The method of claim 1, comprising forming the tunnel insulating layer by a wet oxidization method or a radical oxidization method.

5. The method of claim 1, wherein the blocking gate is formed of a conductive material which includes polysilicon, metal, or both.

6. The method of claim 1, comprising forming the blocking insulation layer of an oxide layer having a high dielectric constant.

7. The method of claim 6, wherein the oxide layer having the high dielectric constant is selected from the group consisting of $AL_2O_3$, $HfO_2$, $ZrO_3$, $AL_2O_3$, —$HfO_2$-containing mixtures, $SrTiO_3$, $La_2O_3$, and $(Ba, Sr)TiO_3$.

8. The method of claim 6, comprising forming the blocking insulation layer by an atomic layer deposition (ALD) method, a plasma-enhanced chemical vapor deposition (PE-ALD) method, or a chemical vapor deposition (CVD) method followed by a Rapid Thermal Annealing (RTA) process.

9. The method of claim 8, comprising forming the blocking insulation layer at a deposition temperature of 200° C. to 1000° C./sec.

10. The method of claim 9, comprising forming the blocking insulation layer by the RTA process at a temperature higher than the deposition temperature, comprising a step-up rate of 1° C./sec to 100° C./sec.

11. The method of claim 1, comprising substituting a SiN layer for the blocking insulation layer.

12. The method of claim 2, comprising forming the openings by an etch process employing an etch mask, wherein the etch mask is formed using a nitride layer, an oxide layer, amorphous carbon, or a photoresist.

13. The method of claim 1, comprising forming the gate electrode using a polysilicon layer, or by laminating a metal layer over the polysilicon layer.

14. The method of claim 13, comprising forming the metal layer using a member selected from the group consisting of tungsten, tungsten silicide, tungsten nitride layer, Ru, Ir, $RuO_2$, $IrO_2$, and Pt.

* * * * *